(12) United States Patent
Feng et al.

(10) Patent No.: US 10,739,415 B2
(45) Date of Patent: Aug. 11, 2020

(54) PRINTED CIRCUIT BOARD AND DETECTION METHOD FOR DETECTING CONNECTION BETWEEN PRINTED CIRCUIT BOARD AND FLEXIBLE CIRCUIT BOARD, AND DISPLAY PANEL

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Xia Feng, Beijing (CN); Changjun Zhang, Beijing (CN); Lingling Liu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 875 days.

(21) Appl. No.: 15/130,437

(22) Filed: Apr. 15, 2016

(65) Prior Publication Data
US 2016/0341781 A1    Nov. 24, 2016

(30) Foreign Application Priority Data

May 19, 2015    (CN) .......................... 2015 1 0256534

(51) Int. Cl.
*G01R 31/04*    (2006.01)
*G01R 31/70*    (2020.01)
(Continued)

(52) U.S. Cl.
CPC ........... *G01R 31/70* (2020.01); *H01R 12/613* (2013.01); *H01R 13/6683* (2013.01);
(Continued)

(58) Field of Classification Search
CPC    G01R 31/046; H01R 12/613; H01R 13/6683; H05K 1/0268; H05K 2201/10128; H05K 2201/10189
See application file for complete search history.

(56) References Cited

U.S. PATENT DOCUMENTS 5,213,511 A * 5/1993 Sobhani ................. H01R 12/61
439/329
2004/0058565 A1* 3/2004 Norland ................. H01R 12/62
439/67

(Continued)

FOREIGN PATENT DOCUMENTS

CN    101408583 A    4/2009
CN    101841090 A    9/2010
(Continued)

OTHER PUBLICATIONS

Office Action dated Aug. 2, 2016 issued in corresponding Chinese Application No. 201510256534.5.

*Primary Examiner* — Son T Le
*Assistant Examiner* — Adam S Clarke
(74) *Attorney, Agent, or Firm* — Nath, Goldberg & Meyer; Joshua B. Goldberg

(57) ABSTRACT

The invention provides a printed circuit board and a detection method for detecting a connection between the printed circuit board and a flexible circuit board, and a display panel. The printed circuit board, through a connector provided thereon, is connected to a flexible circuit board, the printed circuit board is provided thereon with at least one first detection structure for matching with at least one second detection structure provided on the flexible circuit board, and whether or not a connection between the printed circuit board and the flexible circuit board is correct is determined by detecting matching between the first detection structures and the second detection structures. Pins of the printed (Continued)

circuit board may be correctly connected to pins of the flexible circuit board, and a case that short circuit occurs and thus the signal lines are damaged and burned can be avoided.

10 Claims, 2 Drawing Sheets

(51) Int. Cl.
  *H01R 13/66* (2006.01)
  *H01R 12/61* (2011.01)
  *H05K 3/36* (2006.01)
  *H05K 1/02* (2006.01)

(52) U.S. Cl.
  CPC ........... *H05K 1/0268* (2013.01); *H05K 3/365* (2013.01); *H05K 2201/10128* (2013.01); *H05K 2201/10151* (2013.01); *H05K 2201/10189* (2013.01)

(56) References Cited

U.S. PATENT DOCUMENTS

| | | | | |
|---|---|---|---|---|
| 2004/0100735 | A1* | 5/2004 | Nakatani | G11B 5/5552 360/294.4 |
| 2006/0258179 | A1* | 11/2006 | Watanabe | H05K 1/117 439/55 |
| 2011/0076864 | A1* | 3/2011 | Won | H01R 12/88 439/77 |
| 2014/0029230 | A1* | 1/2014 | Oh | H05K 1/14 361/803 |
| 2018/0242912 | A1* | 8/2018 | Amimori | A61B 5/6804 |

FOREIGN PATENT DOCUMENTS

| | | |
|---|---|---|
| CN | 102916307 A | 2/2013 |
| CN | 103091599 A | 5/2013 |
| CN | 103399252 A | 11/2013 |
| EP | 1936395 B1 | 10/2014 |
| JP | 2001230504 A | 8/2001 |
| JP | 2012221884 A | 11/2012 |

\* cited by examiner

PRINTED CIRCUIT BOARD AND DETECTION METHOD FOR DETECTING CONNECTION BETWEEN PRINTED CIRCUIT BOARD AND FLEXIBLE CIRCUIT BOARD, AND DISPLAY PANEL

FIELD OF THE INVENTION

The present invention relates to the field of display technology, and particularly to a printed circuit board and a detection method for detecting a connection between the printed circuit board and a flexible circuit board, and a display panel.

BACKGROUND OF THE INVENTION

At present, display devices are developing towards thinness and lightness, narrow frame and the like, which makes higher demand on miniaturization of components in a display device. Therefore, miniaturized components are more frequently adopted in a display device, wherein a thin connector, which has a small volume and a small thickness, is adopted as one for connecting a printed circuit board and a flexible circuit board.

In the thin connector, a pitch between two adjacent pins is small, and the cover is narrow, small, light and thin, so that the connector has a small thickness and thus may occupy a small space.

However, when such a connector is adopted in the display device, since the pitch is small, difficulty in correctly aligning pins of the flexible circuit board with pins of the connector corresponding thereto is increased, thus error connection between the pins of the printed circuit board and the pins of the connector is liable to happen, causing the signal lines to be damaged and even burned. In addition, since the cover of the connector is relatively small, force bearing area between the flexible printed circuit board and the connector is decreased, the cover is readily to get loose when the flexible circuit board is plugged, which will result in had contact of signal connection or incline of the flexible circuit board.

SUMMARY OF THE INVENTION

The present invention is directed to solve one of the above problems in the prior art, and provides a printed circuit board and a detection method for detecting a connection between the printed circuit board and a flexible circuit board, and a display panel, which can allow correct connection between the printed circuit board and the flexible circuit board, and prevent short circuit which will damage and burn signal lines from occurring.

To achieve the object of the present invention, the present invention provides a printed circuit board, which is connected to a flexible circuit board through a connector, wherein the printed circuit board is provided thereon with at least one first detection structure for matching with at least one second detection structure provided on the flexible circuit board, and wherein whether or not a connection between the printed circuit board and the flexible circuit board is correct is determined by detecting matching between the at least one first detection structure and the at least one second detection structure.

Preferably, the first detection structure is a convex part, and the second detection structure is a concave part.

Preferably, the convex part is a copper solid dot, and the concave part is a copper hollow dot.

Preferably, the first detection structure is close to the connector, and the second detection structure is located below a socket of the flexible circuit board for connecting to the connector.

Preferably, the first detection structure is located at one end of the connector.

Preferably, the first detection structure is a first test point provided on a pin of the printed circuit board;

the second detection structure is a second test point provided on a pin of the flexible circuit board, wherein in a case that the flexible circuit board is correctly connected to the connector, the first test point is electrically connected to the second test point.

Preferably, at least one pin adjacent to each pin of the printed circuit board having the first test point is provided with a first test point.

As another solution, the present invention provides a detection method for detecting a connection between a printed circuit board and a flexible circuit board, for detecting whether or not the printed circuit board and the flexible circuit board are correctly connected, the printed circuit board is connected to the flexible circuit board through a connector, the printed circuit board is provided thereon with at least one first detection structure for matching with at least one second detection structure provided on the flexible circuit board, wherein whether or not the connection between the printed circuit board and the flexible circuit board is correct is determined by detecting matching between the at least one first detection structure and the at least one second detection structure.

Preferably, the first detection structure is a convex part, and the second detection structure is a concave part, and wherein whether or not the connection between the printed circuit board and the flexible circuit board is correct is determined according to whether or not the first detection structure and the second detection structure are correctly matched with each other.

Preferably, the first detection structure is a first test point provided on a pin of the printed circuit board, and the second detection structure is a second test point provided on a pin of the flexible circuit board, a resistance between the first test point and a second test point corresponding thereto is detected, and whether or not the pin where the first test point is located is correctly connected to a pin where the second test point is located according to value of the detected resistance.

Preferably, a resistance between the first test point and another second test point corresponding to another first test point provided on another pin adjacent to that the first test point is located on is detected, and whether or not the pin, of the printed circuit board, where the first test point is located is connected to a pin of the flexible circuit board corresponding to the another pin adjacent to the pin where the first test point is located is determined according to the detected resistance.

As another solution, the present invention provides a display device comprising the above printed circuit board.

The present invention can achieve the following beneficial effects:

In the printed circuit board provided in the present invention, through matching the printed circuit board having the first detection structure with the flexible circuit board having the second detection structure, connection error between the printed circuit board and the flexible circuit board can be avoided, and thus damage and burning of the signal lines can be avoided, and at the same time, bad contact of signal connection and incline of the flexible circuit board can also be avoided.

In the detection method for detecting a connection between the printed circuit board and a flexible circuit board, through matching the first detection structure with the second detection structure, connection error between the printed circuit board and the flexible circuit board can be avoided, and thus damage and burning of the signal lines can be avoided, and at the same time, bad contact of signal connection and incline of the flexible circuit board can also be avoided.

Since the display device provided in the present invention comprises the above printed circuit board, connection error between the printed circuit board and the flexible circuit board can be avoided, and thus damage and burning of the signal lines can be avoided, and at the same time, bad contact of signal connection and incline of the flexible circuit board can also be avoided.

BRIEF DESCRIPTION OF THE DRAWINGS

The accompanying drawings are used for providing further understanding of the present invention, constitute a part of the specification, and are used for explaining the present invention together with implementations hereinafter but not intended to limit the present invention. In the drawings.

REFERENCE NUMERALS

1: printed circuit board; 2: connector; 3: flexible circuit board; 10: first detection structure; and 30: second detection structure.

DETAILED DESCRIPTION OF THE EMBODIMENTS

The present invention will be further described below in detail in conjunction with the accompanying drawings and specific implementations. It should be understood that, the implementations described herein are only used to illustrate and interpret the present invention, and not to limit the present invention.

Figure 1:
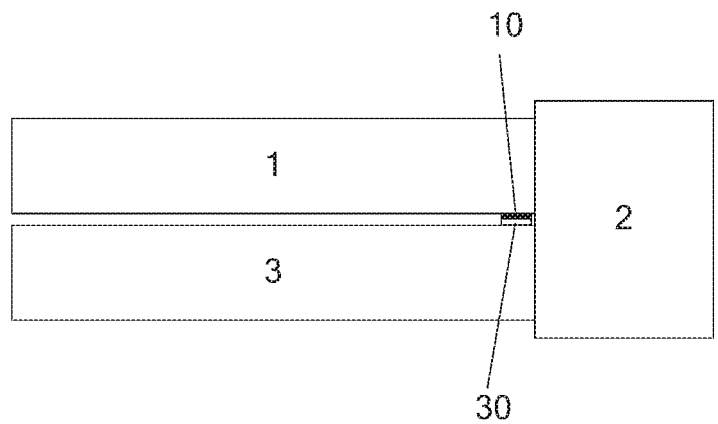
FIG. 1(a) and FIG. 1(b) are schematic diagrams of connection between a printed circuit board and a flexible circuit board through a connector provided in a first embodiment of the present invention.
Figure 1:
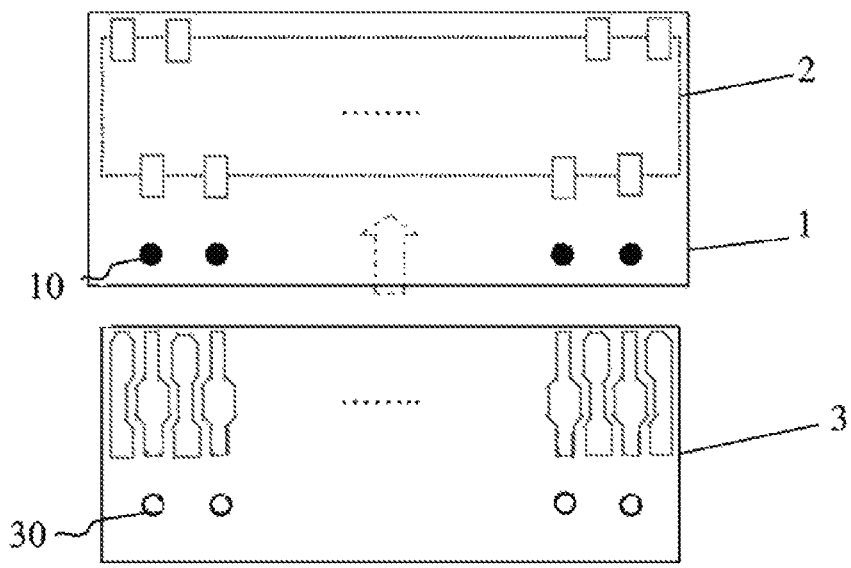

FIG. 1(a) and FIG. 1(b) are schematic diagram of connection between a printed circuit board and a flexible circuit board through a connector provided in a first embodiment of the present invention. In this embodiment, as shown in FIG. 1(a) and FIG. 1(b), the printed circuit board 1 is connected to the flexible circuit board 3 through the connector 2, the printed circuit board 1 is provided with first detection structures 10, the flexible circuit board 3 is provided with second detection structures 30, positions of the first detection structures 10 correspond to those of the second detection structures 30, so that the first detection structures 10 and the second detection structures 30 match with each other after the first detection structures 10 and the second detection structures 30 are connected through the connector 2, thus whether or not the printed circuit board 1 is correctly connected to the flexible circuit board 3 can be detected by detecting the matching between the first detection structures 10 and the second detection structures 30. Specifically, the first detection structures 10 may be convex parts, and the second detection structures 30 may be concave parts/holes.

In this embodiment, by the concave-convex matching between the first detection structures 10 and the second detection structures 30, whether or not the printed circuit board 1 is correctly connected to the flexible circuit board 3 may be judged when the printed circuit board 1 is connected to the flexible circuit board 3 through the connector 2. In a case that the printed circuit board 1 is incorrectly connected to the flexible circuit board 3 due to deviation, the printed circuit board 1 and the flexible circuit board 3 may be separated from each other and reconnected, till they are correctly connected together.

A person skilled in the art should understand that, generally, the printed circuit board is fixedly connected to (for example, welded to) the connector, and the flexible circuit board is connected to the printed circuit board through the connector, at this time, whether or not the printed circuit board is correctly connected to the flexible circuit board may be determined only by detecting the connection between the flexible circuit board and the connector.

Figure 2:
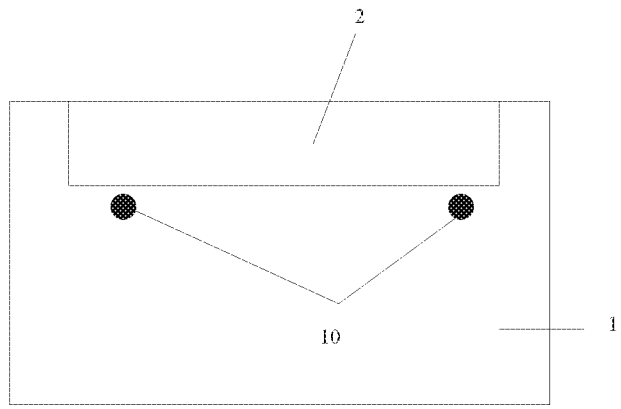
FIG. 2 is a schematic diagram of first arrangement positions of the first detection structures.
Figure 3:
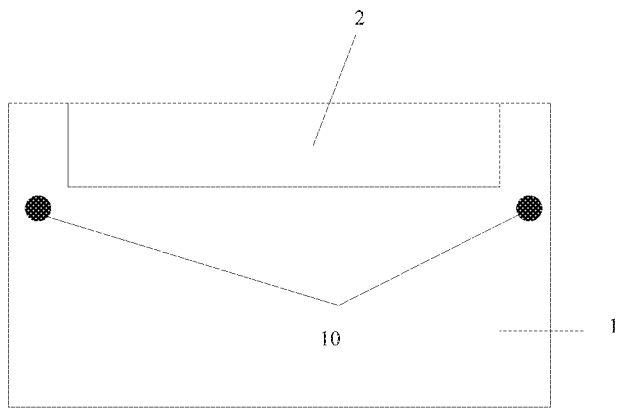
FIG. 3 is a schematic diagram of second arrangement positions of the first detection structures.

Specifically, at least one first detection structure 10 (a plurality of first detection structures 10 are shown in drawings) may be provided on the printed circuit board 1 at position close to the connector 2, as shown in FIG. 2, at least one second detection structure 30 is provided below a socket of the flexible circuit board 3 for connecting with the connector 2. Positions of the first detection structures 10 correspond to those of the second detection structures 30, so that when the connector is inserted into the socket of the flexible circuit board, the first detection structures 10 may match with the second detection structures 30, and whether or not the printed circuit board is correctly connected to the flexible circuit board may be determined by detecting the matching between the first detection structures 10 and the second detection structures 30. Alternatively, the second detection structures 30 may be provided at blank spaces on the printed circuit board 1 at two sides of the connector 2 and close to the connector 2, as shown in FIG. 3.

Compared with the prior art, this embodiment can avoid the case that pins of the printed circuit board 1 and pins of the flexible circuit board 3 are short circuited due to the fact that connection therebetween is error, thus the signal lines can be protected from being damaged and burned.

Specifically, the first detection structure 10 may be a copper solid dot, and the second detection structure 30 may be a copper hollow dot, so that the first detection structure 10 and the second detection structure 30 may be manufactured easily, and the manufactured first detection structure 10 and second detection structure 30 are easily concave-convex matched in shapes. Certainly, the first detection structure 10 may be a copper hollow dot, and the second detection structure 30 may be a copper solid dot.

Figure 4:
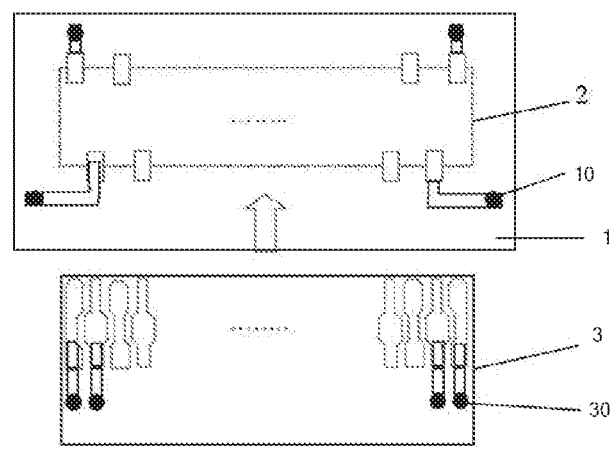
FIG. 4 is a schematic diagram of a printed circuit board provided in a second embodiment of the present invention.

FIG. 4 is a schematic diagram of a printed circuit board provided in a second embodiment of the present invention. As shown in FIG. 4, in this embodiment, there is at least one first detection structure 10, and unlike the first embodiment, the first detection structure 10 is a first test point on a pin of the printed circuit board 1, and the second detection structure 30 is provided on a pin of the flexible circuit board 3, and each second detection structure 30 corresponding to the first detection structure 10 is a second test point provided on a pin of the flexible circuit board 3 corresponding to the pin of the printed circuit board 1 where the first test point is located.

In this embodiment, in a case that the printed circuit board 1 is connected to the flexible circuit board 3 through the connector 2, if the printed circuit board 1 is correctly connected to the connector 2, every pin of the flexible circuit board 3 is connected to a pin of the printed circuit board 1 corresponding thereto, in contrast, if a certain pin of the flexible circuit board 3 is not connected to a pin of the connector 2 corresponding thereto, the printed circuit board 1 is not correctly connected to the flexible circuit board 3. In this case, whether or not the flexible circuit board 3 is correctly connected to the connector 2 may be determined by detecting a resistance between the first test point and the second test point corresponding to this first test point. Specifically, if value of the resistance between the first test point and the second test point corresponding to this first test point is very small, it is indicated that this first test point is correctly connected to this second test point, that is, the printed circuit board 1 is correctly connected to the flexible circuit board 3, at this time, it can be judged that the flexible circuit board 3 is correctly connected to the connector 2. On the other hand, if value of the resistance between a certain first test point and a second test point corresponding thereto is large, it is indicated that this first test point is not electrically connected to this second test point corresponding thereto, that is, the printed circuit board 1 is not correctly connected to the flexible circuit board 3, at this time, it can be judged that the flexible circuit board 3 is not correctly connected to the connector 2.

According to above, it should be understood that, the larger the number of the first detection structures 10 is, the more correct the judgment for the connection between the flexible circuit board 3 and the connector 2 is.

In this embodiment, preferably, at least one pin adjacent to each pin of the printed circuit board having a first test point provided thereon is also provided with a first test point. Thus when whether or not the printed circuit board 1 is correctly connected to the flexible circuit board 3 is detected, besides detecting the resistance between each first test point and a second test point corresponding thereto so as to perform the above judgment, a resistance between one first test point and another second test point corresponding to another first test point adjacent to the one first test point is detected, so as to detect whether or not a pin where the another first test point is located is inserted incorrectly, that is, the pin of the flexible circuit board 3 is not correctly connected to one pin of the connector 2 corresponding thereto, but is connected to another pin of the connector adjacent to the one pin. For example, if value of the resistance between a certain first test point and a second test point corresponding thereto is large, but value of the resistance between the certain first test point and a second test point corresponding to another first test point adjacent to the certain first test point is small, it is indicated that incorrect insertion of pins occurs.

In summary, each of the printed circuit boards 1 provided in the above two embodiments matches, through the first detection structures 10, with the flexible circuit board 3 having the second detection structures 30, so that connection error between the printed circuit board 1 and the flexible circuit board 3 can be avoided, and thus damage and burning of the signal lines can be avoided, and at the same time, bad contact of signal connection and incline of the flexible circuit board can also be avoided.

In the present invention, a detection method for detecting a connection between the printed circuit board and a flexible circuit board is provided and used to detect whether or not the printed circuit board is correctly connected to the flexible circuit board. In this embodiment, the detection method detects whether or not the printed circuit board is correctly connected to the flexible circuit board according to the matching between the first detection structures and the second detection structures.

Specifically, in a case that the printed circuit board is that provided in the first embodiment, this detection method detects whether or not the printed circuit board is correctly connected to the flexible circuit board according to whether or not the concave part/hole and the convex part are correctly matched with each other. Principle and procedure of this detection method has been described in detail in the first embodiment, and will not be repeated herein.

Moreover, in a case that the printed circuit board is that provided in the second embodiment, this detection method detects the value of the resistance between the first test point and the second test point corresponding to the first test point with respect to the connection between the flexible circuit board and the connector, and determines whether or not the pin where the first test point is located is correctly connected to the pin where the second test point is located according to the detected value of the resistance. Principle and procedure of this detection method has been described in detail in the second embodiment, and will not be repeated herein.

In this embodiment, preferably, this detection method also detects the resistance between the first detection point and a second detection point corresponding to another first detection point on a pin adjacent to the first detection point with respect to the flexible circuit board, and determines whether or not the pin of the printed circuit board where the first detection point is located is connected to a pin of the flexible circuit board corresponding to another pin of the printed circuit board adjacent to the pin where the first detection point is located according to the detected value of the resistance. Thus whether or not there is error insertion between the flexible circuit board and the connector can be detected.

In the detection method for detecting connection between the printed circuit board and the flexible circuit board, through matching the first detection structure on the printed circuit board with the second detection structure on the flexible circuit board, connection error between the printed circuit board and the flexible circuit board can be avoided, and thus damage and burning of the signal lines can be avoided, and at the same time, bad contact of signal connection and incline of the flexible circuit board can also be avoided.

In an embodiment, the present invention further provides a display panel, in this embodiment, the display panel comprises the printed circuit board provided in the above embodiment of the present invention.

In the display panel provided in this embodiment comprising the printed circuit board provided in the above embodiment of the present invention, connection error between the printed circuit board and the flexible circuit board can be avoided, and thus damage and burning of the signal lines can be avoided, and at the same time, bad contact of signal connection and incline of the flexible circuit board can also be avoided.

It can be understood that the foregoing implementations are merely exemplary implementations used for describing the principle of the present invention, but the present invention is not limited thereto. Those of ordinary skill in the art may make various variations and improvements without departing from the spirit and essence of the present invention, and these variations and improvements shall fall into the protection scope of the present invention.

The invention claimed is:

1. A printed circuit board, which is connected to a flexible circuit board through a connector, wherein the printed circuit board is provided thereon with at least one first detection structure for matching with at least one second detection structure provided on the flexible circuit board, and wherein
the first detection structure is a convex part, and the second detection structure is a concave part,
whether or not connections between pins of the printed circuit board and pins of the flexible circuit board are correct is determined by detecting concave-convex matching between the convex part and the concave part,
the first detection structure is located on the printed circuit board at a position close to the connector, and the first detection structure is located below the connector or at two sides of the connector, and
the second detection structure is located below or at two sides of a socket of the flexible circuit board for connecting with the connector;
wherein the position of the first detection structure corresponds to that of the second detection structure.

2. The printed circuit board of claim 1, wherein the convex part is a copper solid dot, and the concave part is a copper hollow dot.

3. A display panel comprising the printed circuit board of claim 2.

4. The printed circuit board of claim 1, the second detection structure is located below the socket of the flexible circuit board for connecting to the connector.

5. A display panel comprising the printed circuit board of claim 4.

6. A detection method for detecting a connection between a printed circuit board of claim 1 and a flexible circuit board, for detecting whether or not the printed circuit board and the flexible circuit board are correctly connected, the detection method comprising:
detecting concave-convex matching between the convex part and the concave part to determine whether or not the connection between the printed circuit board and the flexible circuit board is correct.

7. A display panel comprising the printed circuit board of claim 1.

8. A printed circuit board, which is connected to a plurality of pins of a flexible circuit board through a plurality of pins, wherein the printed circuit board is provided thereon with at least two first detection structures for matching with at least two second detection structures provided on the flexible circuit board, and wherein
the at least two first detection structures are first test points provided on adjacent pins of the printed circuit board;
the at least two second detection structures are second test points provided on adjacent pins of the flexible circuit board,
whether or not a connection between the printed circuit board and the flexible circuit board is correct is determined by detecting resistance between one first detection structure and a second detection structure corresponding to another first detection structure adjacent to the one first detection structure, and resistance between the one first detection structure and the second detection structure corresponding to the one first detection structure.

9. A detection method for detecting a connection between a printed circuit board of claim 8 and a flexible circuit board, for detecting whether or not the printed circuit board and the flexible circuit board are correctly connected, the detection method comprising:
detecting a resistance between the first test point and the second test point corresponding thereto to determine whether or not the pin where the first test point is located is correctly connected to the pin where the second test point is located according to a value of the detected resistance.

10. A display panel comprising the printed circuit board of claim 8.

* * * * *